(12) United States Patent
Yang et al.

(10) Patent No.: US 12,403,508 B2
(45) Date of Patent: Sep. 2, 2025

(54) LIQUID CHEMICAL SUPPLY MODULE AND SUBSTRATE PROCESSING APPARATUS INCLUDING THE SAME

(71) Applicant: SEMES CO., LTD., Cheonan-si (KR)

(72) Inventors: Seungtae Yang, Yongin-si (KR); Sangwoo Park, Daejeon (KR); Youngjoon Han, Cheonan-si (KR); Seonghyeon Kim, Cheonan-si (KR); Gi Hun Choi, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 151 days.

(21) Appl. No.: 18/487,554

(22) Filed: Oct. 16, 2023

(65) Prior Publication Data

US 2024/0149308 A1     May 9, 2024

(30) Foreign Application Priority Data

Nov. 7, 2022  (KR) .................... 10-2022-0147337

(51) Int. Cl.
    *B08B 3/02*       (2006.01)
    *B05C 5/02*       (2006.01)
    (Continued)

(52) U.S. Cl.
    CPC ............ *B08B 3/022* (2013.01); *B05C 5/0225* (2013.01); *B05C 11/1013* (2013.01); *B08B 3/08* (2013.01); *H01L 21/67051* (2013.01)

(58) Field of Classification Search
    CPC ...................................................... B08B 3/022
    See application file for complete search history.

(56) References Cited

U.S. PATENT DOCUMENTS

| 8,950,414 B2 | 2/2015 | Ito |
| 11,798,819 B2 | 10/2023 | Kosai et al. |
| 2021/0398828 A1* | 12/2021 | Kosai .................. B08B 13/00 |

FOREIGN PATENT DOCUMENTS

| JP | 2012-178512 A | 9/2012 |
| KR | 10-2007-0108791 A | 11/2007 |

(Continued)

OTHER PUBLICATIONS

Office Action for Korean Application No. 10-2022-0147337 dated Mar. 25, 2024.

*Primary Examiner* — Jason Y Ko
(74) *Attorney, Agent, or Firm* — Harness, Dickey & Pierce, P.L.C.

(57) ABSTRACT

Provided is a liquid chemical supply module and a substrate processing apparatus including the same, the liquid chemical supply module including a main supplier for supplying a liquid chemical from a liquid chemical tank to at least one substrate processing apparatus, and at least one distribution supplier for connecting between the main supplier and any one substrate processing apparatus to distribute the liquid chemical supplied through the main supplier to the any one substrate processing apparatus, wherein the distribution supplier includes a distribution line branched from a main line of the main supplier, a first circulation line branched from the distribution line and connecting between the distribution line and the main line, and a second circulation line branched from the distribution line connecting between the distribution line and the main line.

20 Claims, 3 Drawing Sheets

(51) Int. Cl.
  *B05C 11/10* (2006.01)
  *B08B 3/08* (2006.01)
  *H01L 21/67* (2006.01)

(56) References Cited

FOREIGN PATENT DOCUMENTS

| | | |
|---|---|---|
| KR | 10-2009-0059718 A | 6/2009 |
| KR | 10-2011-0013251 A | 2/2011 |
| KR | 10-2015-0077523 A | 7/2015 |
| KR | 10-2021-0158330 A | 12/2021 |

\* cited by examiner

LIQUID CHEMICAL SUPPLY MODULE AND SUBSTRATE PROCESSING APPARATUS INCLUDING THE SAME

CROSS-REFERENCE TO RELATED PATENT APPLICATION

This application claims the benefit of Korean Patent Application No. 10-2022-0147337, filed on Nov. 7, 2022, in the Korean Intellectual Property Office, the disclosure of which is incorporated herein in its entirety by reference.

BACKGROUND OF THE INVENTION

1. Field of the Invention

The present invention relates to a liquid chemical supply module and a substrate processing apparatus including the same and, more particularly, to a liquid chemical supply module capable of supplying a liquid chemical used to process a substrate to a substrate processing apparatus, and a substrate processing apparatus including the same.

2. Description of the Related Art

Various processes such as photolithography, etching, ashing, and deposition are performed to manufacture semiconductor devices or liquid crystal displays. In these processes, due to the miniaturization of circuit patterns on a substrate, device characteristics and production yield are more sensitively affected by particles and contaminants. As such, a cleaning process for removing the particles and contaminants is performed before or after each process. A plurality of chemical supplying, rinsing, and drying processes may be sequentially performed as the cleaning process in a chamber, and contaminants or particles and fumes which are produced in the cleaning process may be exhausted to the outside by inducing the downflow of clean air in the chamber during the cleaning process.

When the substrate is cleaned, various types of liquid chemicals may be used to remove the contaminants on the substrate, and each liquid chemical may be ejected onto the substrate through an ejection nozzle positioned above the substrate. The liquid chemical to be ejected through the ejection nozzle to clean the substrate may be controlled to a flow rate suitable for process conditions by a liquid chemical supply module connected to a liquid chemical tank, and then supplied to the ejection nozzle of a substrate processing apparatus.

The liquid chemical supply module for supplying the liquid chemical from the liquid chemical tank to the substrate processing apparatus may be connected to a plurality of substrate processing apparatuses to supply the liquid chemical thereto and, in this case, a back pressure valve (BPV) may be mounted on a main line connected to the liquid chemical tank so as to maintain a pressure of the liquid chemical in the main line at a constant pressure.

However, according to the existing liquid chemical supply module, although the liquid chemical is ejected at the same flow rate through the main line, an opening ratio of a flow control valve (FCV) needs to be controlled differently for a chamber of each substrate processing apparatus. For example, when a plurality of chambers are used, a front pressure of the liquid chemical supplied through the main line may be reduced and thus the opening ratio of the FCV may be changed to maintain the ejection rate of the liquid chemical supplied to each chamber. At this time, a dead zone may be reduced due to the change in the opening ratio of the FCV and particles stagnant in the FCV may also be ejected onto the substrate of the substrate processing apparatus. In addition, by setting the opening ratio of the FCV differently for each substrate processing apparatus, equipment and chamber performance deviations may be caused.

SUMMARY OF THE INVENTION

The present invention provides a liquid chemical supply module capable of always maintaining a constant pressure of a liquid chemical, minimizing operation of a flow control value (FCV) during ejection of the liquid chemical, and thus stably maintaining particle performance by mounting a relief valve at a front end of the FCV of every substrate processing apparatus connected to the liquid chemical supply module, and a substrate processing apparatus including the liquid chemical supply module. However, the above description is an example, and the scope of the present invention is not limited thereto.

According to an aspect of the present invention, there is provided a liquid chemical supply module including a main supplier for supplying a liquid chemical from a liquid chemical tank to at least one substrate processing apparatus, and at least one distribution supplier for connecting between the main supplier and any one substrate processing apparatus to distribute the liquid chemical supplied through the main supplier to the any one substrate processing apparatus, wherein the distribution supplier includes a distribution line branched from a main line of the main supplier and connecting between the main line and the any one substrate processing apparatus, a first circulation line branched from the distribution line and connecting between the distribution line and the main line to circulate at least a portion of the liquid chemical flowing in the distribution line back to the main line, and a second circulation line branched from the distribution line in front of the first circulation line with respect to a direction of the liquid chemical flowing through the distribution line, and connecting between the distribution line and the main line to circulate at least a portion of the liquid chemical flowing in the distribution line back to the main line in front of the first circulation line.

The main supplier may include the main line for supplying the liquid chemical from the liquid chemical tank, and a back pressure valve (BPV) mounted on the main line in front of the distribution line with respect to a direction of the liquid chemical flowing through the main line, to maintain a pressure of the liquid chemical flowing in the main line at a preset certain main pressure.

The main supplier may further include a pressure sensor mounted on the main line between the BPV and the distribution line to sense the pressure of the liquid chemical flowing in the main line behind the BPV.

The distribution line may include a flow control valve (FCV) mounted on the distribution line to control a flow rate of the liquid chemical supplied to the any one substrate processing apparatus.

The distribution line may further include a first on/off valve mounted on the distribution line behind the FCV with respect to the direction of the liquid chemical flowing through the distribution line, to open or close the distribution line.

The first circulation line may be branched from the distribution line behind the FCV with respect to the direction of the liquid chemical flowing through the distribution line, and connected to the main line in front of the BPV with respect to the direction of the liquid chemical flowing through the main line.

The first circulation line may include a second on/off valve mounted on the first circulation line to open or close the first circulation line.

The second circulation line may be branched from the distribution line in front of the FCV with respect to the direction of the liquid chemical flowing through the distribution line, and connected to the main line in front of the BPV with respect to the direction of the liquid chemical flowing through the main line.

The second circulation line may include a relief valve mounted at a position where the second circulation line is branched from the distribution line, to circulate at least a portion of the liquid chemical flowing in the distribution line back to the main line when the pressure of the liquid chemical flowing in the distribution line exceeds a preset certain distribution pressure.

The second circulation line may further include a third on/off valve mounted on the second circulation line to open or close the second circulation line. The distribution line may further include a flowmeter mounted on the distribution line in front of the FCV with respect to the direction of the liquid chemical flowing through the distribution line, to measure a flow rate of the liquid chemical flowing in the distribution line.

The distribution line may further include a flow controller electrically connected to the FCV and the flowmeter to receive a value of sensing the flow rate of the liquid chemical from the flowmeter and apply a control signal to the FCV.

The flow controller may apply the control signal to the FCV based on a difference between a preset reference flow rate and an actual flow rate of the liquid chemical calculated using the sensed value received from the flowmeter, to control the difference between the reference flow rate and the actual flow rate of the liquid chemical within a preset certain error range.

The main supplier may set the main pressure of the liquid chemical having passed through the BPV and flowing in the main line, to be higher than a distribution pressure of the liquid chemical distributed through the distribution supplier and supplied to the any one substrate processing apparatus.

The distribution supplier may include a plurality of distribution suppliers mounted at certain intervals along the main line of the main supplier to distribute the liquid chemical supplied through the main supplier, to a plurality of substrate processing apparatuses.

The distribution suppliers may include a first distribution supplier for connecting between the main line and a first substrate processing apparatus, and a second distribution supplier for connecting between the main line and a second substrate processing apparatus behind the first distribution supplier with respect to a direction of the liquid chemical flowing through the main line.

Each of the first and second distribution suppliers may include the distribution line, the first circulation line, and the second circulation line.

The distribution suppliers may further include an nth distribution supplier for connecting between the main line and an nth substrate processing apparatus behind an (n−1)th distribution supplier with respect to the direction of the liquid chemical flowing through the main line.

According to another aspect of the present invention, there is provided a substrate processing apparatus including a chamber including a processing space where a substrate is processed, a substrate support unit mounted in the processing space to support and rotate the substrate, an ejection unit mounted above the substrate support unit in the processing space to eject at least one type of liquid chemical onto the substrate through an ejection nozzle, a liquid chemical supply module for supplying the liquid chemical to the ejection unit, and a collection unit provided in a vessel shape with an open top to surround the substrate support unit and mounted in the processing space to collect the liquid chemical scattered from the substrate when the substrate rotates, wherein the liquid chemical supply module includes a main supplier for supplying the liquid chemical from a liquid chemical tank to the ejection nozzle of the ejection unit, and a distribution supplier for connecting between the main supplier and the ejection nozzle to distribute the liquid chemical supplied through the main supplier to the ejection nozzle of the ejection unit, and wherein the distribution supplier includes a distribution line branched from a main line of the main supplier and connecting between the main line and the ejection nozzle, a first circulation line branched from the distribution line and connecting between the distribution line and the main line to circulate at least a portion of the liquid chemical flowing in the distribution line back to the main line, and a second circulation line branched from the distribution line in front of the first circulation line with respect to a direction of the liquid chemical flowing through the distribution line, and connecting between the distribution line and the main line to circulate at least a portion of the liquid chemical flowing in the distribution line back to the main line in front of the first circulation line.

According to another aspect of the present invention, there is provided a liquid chemical supply module including a main supplier for supplying a liquid chemical from a liquid chemical tank to at least one substrate processing apparatus, and at least one distribution supplier for connecting between the main supplier and any one substrate processing apparatus to distribute the liquid chemical supplied through the main supplier to the any one substrate processing apparatus, wherein the distribution supplier includes a distribution line branched from a main line of the main supplier and connecting between the main line and the any one substrate processing apparatus, a first circulation line branched from the distribution line and connecting between the distribution line and the main line to circulate at least a portion of the liquid chemical flowing in the distribution line back to the main line, and a second circulation line branched from the distribution line in front of the first circulation line with respect to a direction of the liquid chemical flowing through the distribution line, and connecting between the distribution line and the main line to circulate at least a portion of the liquid chemical flowing in the distribution line back to the main line in front of the first circulation line, wherein the main supplier includes the main line for supplying the liquid chemical from the liquid chemical tank, a back pressure valve (BPV) mounted on the main line in front of the distribution line with respect to a direction of the liquid chemical flowing through the main line, to maintain a pressure of the liquid chemical flowing in the main line at a preset certain main pressure, and a pressure sensor mounted on the main line between the BPV and the distribution line to sense the pressure of the liquid chemical flowing in the main line behind the BPV, wherein the distribution line includes a flow control valve (FCV) mounted on the distribution line to control a flow rate of the liquid chemical supplied to the any one substrate processing apparatus, a flowmeter mounted on the distribution line in front of the FCV with respect to the direction of the liquid chemical flowing through the distribution line, to measure a flow rate of the liquid chemical flowing in the distribution line, and a first on/off valve mounted on the distribution line behind the FCV with respect to the direction of the liquid chemical flowing through the distribution line, to open or close the distribution line, wherein the first circulation line is branched from the distribution line behind the FCV with respect to the direction of the liquid chemical flowing through the distribution line, and connected to the main line in front of the BPV with respect to the direction of the liquid chemical flowing through the main line, and wherein the second circulation line is branched from the distribution line in front of the FCV with respect to the direction of the liquid chemical flowing through the distribution line, and connected to the main line in front of the BPV with respect to the direction of the liquid chemical flowing through the main line, and includes a relief valve mounted at a position where the second circulation line is branched from the distribution line, to circulate at least a portion of the liquid chemical flowing in the distribution line back to the main line when the pressure of the liquid chemical flowing in the distribution line exceeds a preset certain distribution pressure.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
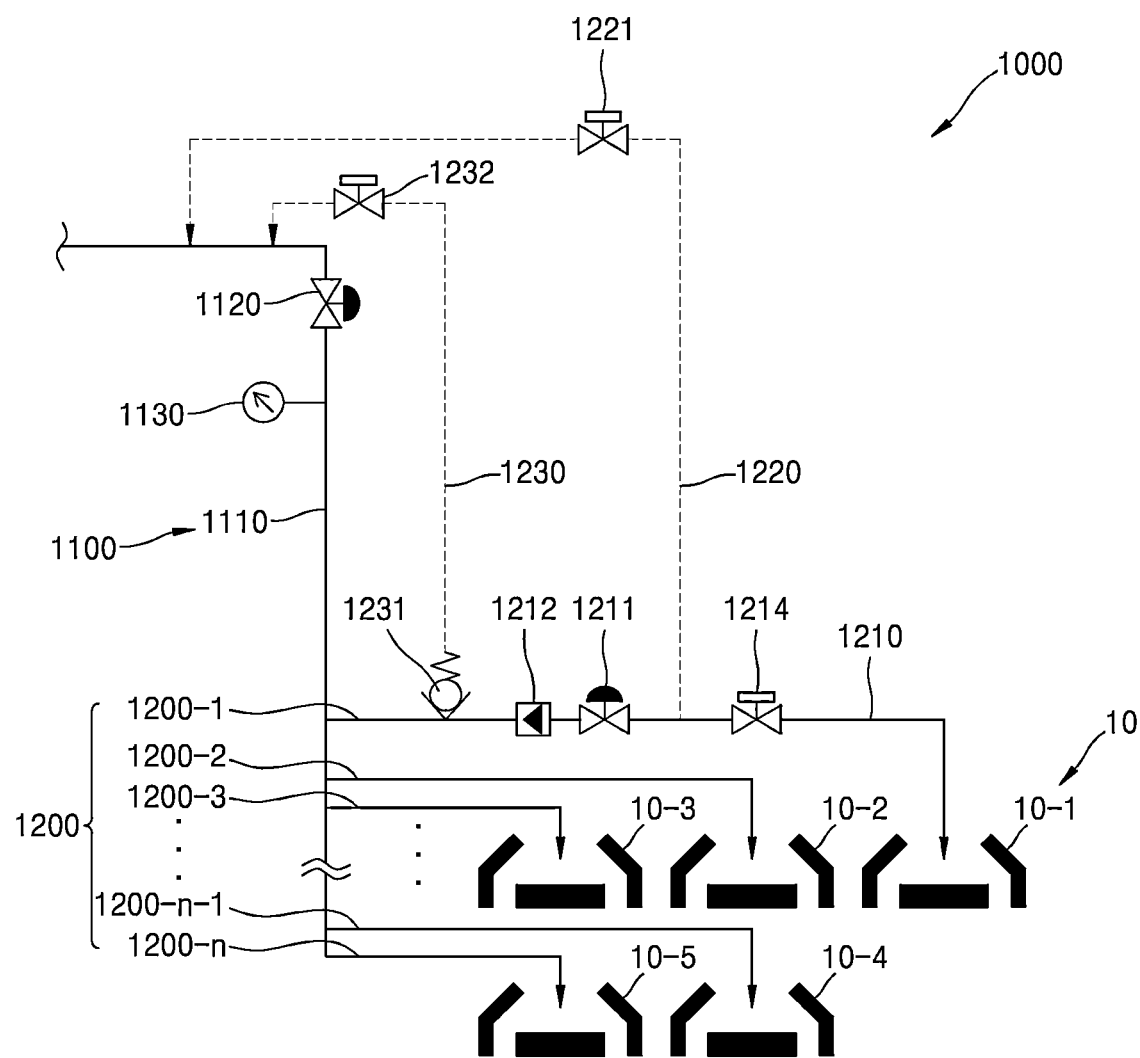
FIG. 1 is a conceptual view of a liquid chemical supply module according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
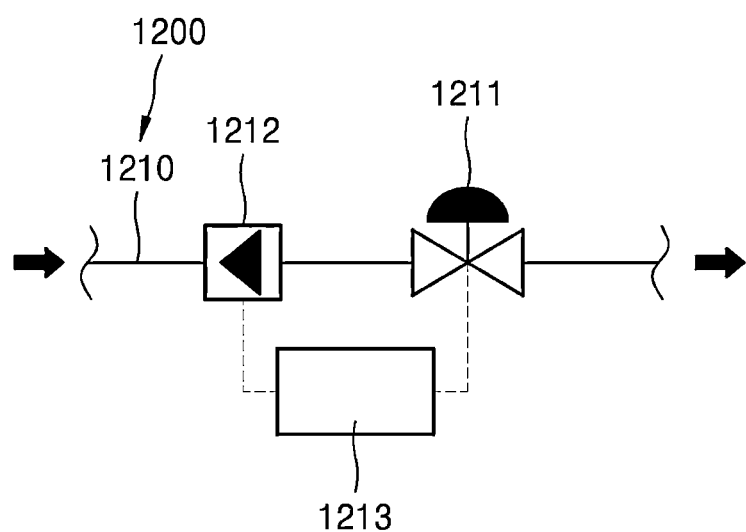
FIG. 2 is a conceptual view of a portion of a distribution supplier of the liquid chemical supply module of FIG. 1.
Figure 3:
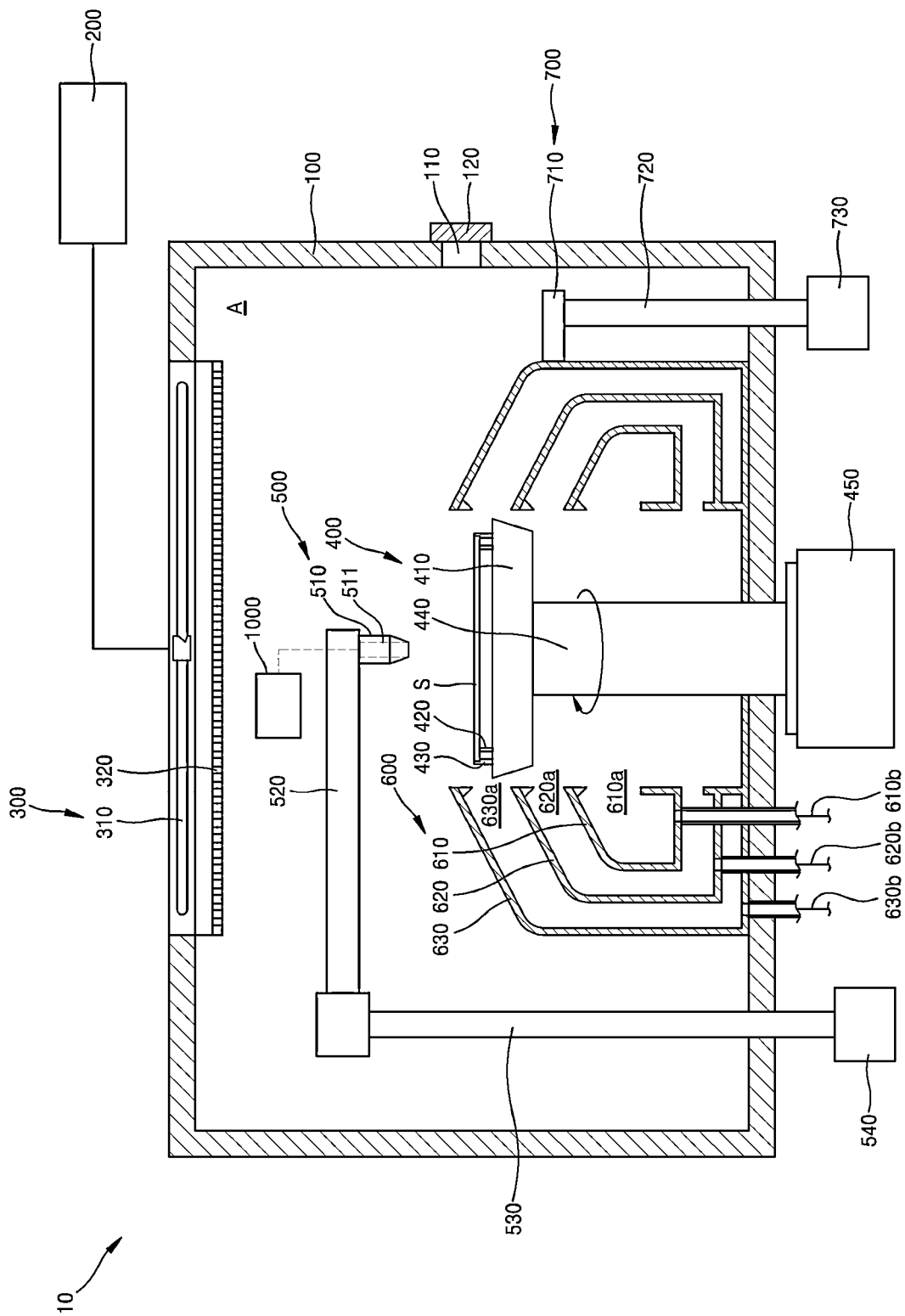
FIG. 3 is a conceptual view of a substrate processing apparatus including the liquid chemical supply module of FIG. 1.

FIG. 1 is a conceptual view of a liquid chemical supply module 1000 according to an embodiment of the present invention, FIG. 2 is a conceptual view of a portion of a distribution supplier 1200 of the liquid chemical supply module 1000 of FIG. 1, and FIG. 3 is a conceptual view of a substrate processing apparatus 10 including the liquid chemical supply module 1000 of FIG. 1.

Initially, as shown in FIG. 1, the liquid chemical supply module 1000 according to an embodiment of the present invention may mainly include a main supplier 1100 and a plurality of distribution suppliers 1200.

As shown in FIG. 1, the main supplier 1100 may supply a liquid chemical from a liquid chemical tank (not shown) to a plurality of substrate processing apparatuses 10, and the plurality of distribution suppliers 1200 may connect between the main supplier 1100 and first, second, third, fourth, and fifth substrate processing apparatuses 10-1, 10-2, 10-3, 10-4, and 10-5 to distribute the liquid chemical supplied through the main supplier 1100 to the plurality of substrate processing apparatuses 10.

Specifically, the main supplier 1100 may include a main line 1110 for supplying the liquid chemical from the liquid chemical tank, a back pressure valve (BPV) 1120 mounted on the main line 1110 in front of the plurality of distribution suppliers 1200 with respect to a direction of the liquid chemical flowing through the main line 1110, to maintain a pressure of the liquid chemical flowing in the main line 1110 at a preset certain main pressure, and a pressure sensor 1130 mounted on the main line 1110 between the BPV 1120 and the plurality of distribution suppliers 1200 to sense the pressure of the liquid chemical flowing in the main line 1110 behind the BPV 1120.

For example, the BPV 1120 may serve to control the pressure of the liquid chemical flowing in the main line 1110 to be maintained at the main pressure at a front end of the main line 1110, and also serve to prevent backflow and oversupply of the liquid chemical through the main line 1110.

The plurality of distribution suppliers 1200 may be mounted at certain intervals along the main line 1110 of the main supplier 1100 to distribute the liquid chemical supplied through the main supplier 1100, to the plurality of substrate processing apparatuses 10.

For example, the plurality of distribution suppliers 1200 may include a first distribution supplier 1200-1 for connecting between the main line 1110 and a first substrate processing apparatus 10-1, a second distribution supplier 1200-2 for connecting between the main line 1110 and a second substrate processing apparatus 10-2 behind the first distribution supplier 1200-1 with respect to the direction of the liquid chemical flowing through the main line 1110, a third distribution supplier 1200-3 for connecting between the main line 1110 and a third substrate processing apparatus 10-3 behind the second distribution supplier 1200-2 with respect to the direction of the liquid chemical flowing through the main line 1110, an (n−1)th distribution supplier 1200-$n$−1 for connecting between the main line 1110 and an (n−1)th substrate processing apparatus 10-4 behind the third distribution supplier 1200-3 with respect to the direction of the liquid chemical flowing through the main line 1110, and an nth distribution supplier 1200-$n$ for connecting between the main line 1110 and an nth substrate processing apparatus 10-5 behind the (n−1)th distribution supplier 1200-$n$−1 with respect to the direction of the liquid chemical flowing through the main line 1110. Herein, although five distribution suppliers 1200 are branched from the main line 1110 in FIG. 1, the number of distribution suppliers 1200 is not limited thereto and may include a wide variety of numbers depending on the number of substrate processing apparatuses 10 to be supplied with the liquid chemical.

Although the configuration of only the first distribution supplier 1200-1 is representatively illustrated in FIG. 1 for convenience sake, the first distribution supplier 1200-1, the second distribution supplier 1200-2, the third distribution supplier 1200-3, the (n−1)th distribution supplier 1200-n−1, and the nth distribution supplier 1200-n may equally include a distribution line 1210, a first circulation line 1220, and a second circulation line 1230, which will be described below.

The distribution line 1210 and the first and second circulation lines 1220 and 1230, which may be included in each distribution supplier 1200, will now be described in detail.

As shown in FIG. 1, the distribution supplier 1200 may mainly include the distribution line 1210 and the first and second circulation lines 1220 and 1230. The distribution line 1210 may be branched from the main line 1110 of the main supplier 1100 and connect between the main line 1110 and each substrate processing apparatus 10.

Specifically, as shown in FIGS. 1 and 2, a flow control valve (FCV) 1211 may be mounted on the distribution line 1210 to control a flow rate of the liquid chemical supplied to the substrate processing apparatus 10. The FCV 1211 may determine a required flow rate of the liquid chemical in the distribution line 1210. That is, the FCV 1211 may control the flow rate of the liquid chemical in the distribution line 1210.

A first on/off valve 1214 may be mounted on the distribution line 1210 behind the FCV 1211 with respect to a direction of the liquid chemical flowing through the distribution line 1210, to open or close the distribution line 1210.

A flowmeter 1212 may be mounted on the distribution line 1210 in front of the FCV 1211 with respect to the direction of the liquid chemical flowing through the distribution line 1210, to measure a flow rate of the liquid chemical flowing in the distribution line 1210. A flow controller 1213 electrically connected to the FCV 1211 and the flowmeter 1212 may be mounted on the distribution line 1210 to receive a value of sensing the flow rate of the liquid chemical from the flowmeter 1212 and apply a control signal to the FCV 1211 based on the sensed value.

For example, the flow controller 1213 may apply the control signal to the FCV 1211 based on a difference between a preset reference flow rate and an actual flow rate of the liquid chemical calculated using the sensed value received from the flowmeter 1212, to control the difference between the reference flow rate and the actual flow rate of the liquid chemical within a preset certain error range.

In this case, because the liquid chemical is supplied simultaneously to the plurality of substrate processing apparatuses 10 through the main supplier 1100 and thus the pressure for supplying the liquid chemical distributed through the main line 1110 of the main supplier 1100 to the distribution line 1210 of the distribution supplier 1200 is reduced, when an opening ratio of the FCV 1211 is rapidly increased to maintain an ejection rate of the liquid chemical supplied to each substrate processing apparatus 10, a dead zone in the FCV 1211 may be reduced and thus particles stagnant in the FCV 1211 may be ejected together with the liquid chemical.

However, because the distribution supplier 1200 according to the present invention includes the first and second circulation lines 1220 and 1230, even when the liquid chemical is supplied simultaneously to the plurality of substrate processing apparatuses 10 through the main supplier 1100, the pressure for supplying the liquid chemical distributed through the main line 1110 of the main supplier 1100 to the distribution line 1210 of the distribution supplier 1200 may be constantly maintained and thus the above-described problem may be solved.

For example, as shown in FIG. 1, the first circulation line 1220 may be branched from the distribution line 1210 and connect between the distribution line 1210 and the main line 1110 to circulate at least a portion of the liquid chemical flowing in the distribution line 1210 back to the main line 1110.

Specifically, the first circulation line 1220 may be branched from the distribution line 1210 behind the FCV 1211 with respect to the direction of the liquid chemical flowing through the distribution line 1210, e.g., between the FCV 1211 and the first on/off valve 1214, and connected to the main line 1110 in front of the BPV 1120 with respect to the direction of the liquid chemical flowing through the main line 1110. A second on/off valve 1221 may be mounted on the first circulation line 1220 to selectively open or close the first circulation line 1220.

As such, the first circulation line 1220 may circulate the entirety of the liquid chemical supplied through the distribution line 1210 back to a front end of the BPV 1120 of the main line 1110 when the first on/off valve 1214 of the distribution line 1210 is closed, or circulate a portion of the liquid chemical supplied through the distribution line 1210 back to the front end of the BPV 1120 of the main line 1110 based on the pressure of the liquid chemical when the first on/off valve 1214 is open to supply the liquid chemical to the substrate processing apparatus 10, thereby constantly maintaining the pressure of the liquid chemical flowing in the distribution line 1210.

As shown in FIG. 1, the second circulation line 1230 may be branched from the distribution line 1210 in front of the first circulation line 1220 with respect to the direction of the liquid chemical flowing through the distribution line 1210, and connect between the distribution line 1210 and the main line 1110 to circulate at least a portion of the liquid chemical flowing in the distribution line 1210 back to the main line 1110 in front of the first circulation line 1220.

Specifically, the second circulation line 1230 may be branched from the distribution line 1210 in front of the FCV 1211 and the flowmeter 1212 with respect to the direction of the liquid chemical flowing through the distribution line 1210, and connected to the main line 1110 in front of the BPV 1120 with respect to the direction of the liquid chemical flowing through the main line 1110.

A relief valve 1231 may be mounted at a position where the second circulation line 1230 is branched from the distribution line 1210, to circulate at least a portion of the liquid chemical flowing in the distribution line 1210 back to the main line 1110 when the pressure of the liquid chemical flowing in the distribution line 1210 exceeds a preset certain distribution pressure. A third on/off valve 1232 may also be mounted on the second circulation line 1230 to selectively open or close the second circulation line 1230.

At this time, in order to always bypass a certain amount of the liquid chemical to the second circulation line 1230 through the relief valve 1231, the main supplier 1100 may set the main pressure of the liquid chemical having passed through the BPV 1120 and flowing in the main line 1110, to be higher than the distribution pressure of the liquid chemical distributed through the distribution supplier 1200 and supplied to the substrate processing apparatus 10.

As such, by setting the main pressure of the liquid chemical flowing in the main line 1110 to be always higher than the distribution pressure required to appropriately supply the liquid chemical to the substrate processing apparatus 10 and by always bypassing a certain amount of the liquid chemical through the relief valve 1231 based on a difference between the distribution pressure and the main pressure, even when the liquid chemical is supplied simultaneously to the plurality of substrate processing apparatuses 10 through the main supplier 1100, the pressure for supplying the liquid chemical distributed through the main line 1110 of the main supplier 1100 to the distribution line 1210 of the distribution supplier 1200 may be prevented from being reduced below the distribution pressure and thus changes in the opening ratio of the FCV 1211 to maintain the ejection rate of the liquid chemical supplied to the substrate processing apparatus 10 may be minimized.

The substrate processing apparatus 10 including the above-described liquid chemical supply module 1000 will now be described in detail.

Initially, as shown in FIG. 3, the substrate processing apparatus 10 including the liquid chemical supply module 1000 according to an embodiment of the present invention may mainly include a chamber 100, a gas supply unit 200, a fan filter unit 300, a substrate support unit 400, an ejection unit 500, a collection unit 600, and a lift unit 700.

As shown in FIG. 3, the chamber 100 may include a processing space A where a substrate S is cleaned. For example, the chamber 100 may have a rectangular, polygonal, or circular vessel shape to provide therein the processing space A where the substrate S is cleaned.

The chamber 100 may include a gate 110 provided on a surface thereof facing a transfer chamber (not shown), and the gate 110 may be opened or closed by a door 120. The gate 110 may function as an entrance through which the substrate S may enter.

As shown in FIG. 3, the substrate support unit 400 may be a kind of spin head and be mounted in the processing space A inside the chamber 100 to support and rotate the substrate S during the cleaning process.

Specifically, the substrate support unit 400 may include a spin body 410, support pins 420, chuck pins 430, and a support shaft 440, and the spin body 410 may have a substantially circular upper surface when viewed from above. The support shaft 440 rotatably driven by a driving means 450 may be fixed and coupled to a lower surface of the spin body 410.

A plurality of support pins 420 of the substrate support unit 400 may be provided on the upper surface of the spin body 410. For example, a plurality of support pins 420 may be arranged at certain intervals along an edge of the upper surface of the spin body 410 and thus provided radially and equiangularly from a central axis (or rotational axis) of the spin body 410. As described above, the support pins 420 may be arranged in a circular ring shape overall to support an edge of a rear surface of the substrate S such that the substrate S is spaced apart from the upper surface of the spin body 410 by a certain distance.

A plurality of chuck pins 430 of the substrate support unit 400 may be provided on the upper surface of the spin body 410 and disposed farther away from the central axis of the spin body 410 than the support pins 420. These chuck pins 430 may protrude more than the support pins 420 from the upper surface of the spin body 410 to support a side surface of the substrate S to prevent lateral dislocation of the substrate S due to centrifugal force when the spin body 410 rotates.

The chuck pins 430 may be mounted to linearly move between a standby position and a support position which are spaced apart from each other by a certain distance along a radial direction of the spin body 410. For example, the standby position may be a position farther from the central axis of the spin body 410 than the support position. As such, the chuck pins 430 may be positioned at the standby position when the substrate S is loaded onto or unloaded from the spin body 410, and linearly move and be positioned at the support position when the substrate S is cleaned. At the support position, the chuck pins 430 may be in contact with the side surface of the substrate S.

As shown in FIG. 3, the collection unit 600 may be provided in a vessel shape with an open top to surround the substrate support unit 400 and mounted in the processing space A to collect a liquid chemical scattered from the substrate S when the substrate S rotates.

For example, the collection unit 600 may have a vessel shape with an open top overall and include an inner collection barrel 610, a middle collection barrel 620, and an outer collection barrel 630. The collection barrels 610, 620, and 630 may collect different liquid chemicals used for the cleaning process.

Specifically, the inner collection barrel 610 may be provided in a circular ring shape surrounding the substrate support unit 400, the middle collection barrel 620 may be provided in a circular ring shape surrounding the inner collection barrel 610, and the outer collection barrel 630 may be provided in a circular ring shape surrounding the middle collection barrel 620. A first space 610a of the inner collection barrel 610, a second space 620a of the middle collection barrel 620, and a third space 630a of the outer collection barrel 630 may function as inlets through which the liquid chemicals flow into the inner collection barrel 610, the middle collection barrel 620, and the outer collection barrel 630, respectively.

For example, the inlets of the collection barrels 610, 620, and 630 may be positioned at different heights, and collection lines 610b, 620b, and 630b may be connected to bottom surfaces of the collection barrels 610, 620, and 630, respectively. The collection lines 610b, 620b, and 630b may discharge the liquid chemicals introduced through the collection barrels 610, 620, and 630, respectively, and the discharged liquid chemicals may be recycled and reused through an external liquid chemical recycling system (not shown).

As shown in FIG. 3, the lift unit 700 may lift or lower the collection unit 600 in a vertical direction. When the collection unit 600 is lifted or lowered by the lift unit 700, a height of the collection unit 600 relative to the substrate support unit 400 may be changed.

The lift unit 700 may include a bracket 710, a moving shaft 720, and a h 730. For example, the bracket 710 may be fixed and mounted on an outer wall of the collection unit 600, and the moving shaft 720 moved in a vertical direction by the driver 730 may be fixed and coupled to the bracket 710.

Specifically, when the substrate S is loaded onto or unloaded from the substrate support unit 400, the collection unit 600 may be lowered by the lift unit 700 such that the substrate support unit 400 may protrude upward from the collection unit 600. When the cleaning process is performed, the height of the collection unit 600 may be controlled based on the type of a liquid chemical supplied to the substrate S such that the liquid chemical may flow into a preset collection barrel 610, 620, or 630.

As shown in FIG. 3, the gas supply unit 200 may supply air to the processing space A of the chamber 100. For example, the gas supply unit 200 may supply temperature- and humidity-controlled air to the processing space A of the chamber 100. To this end, although not shown in the drawings, the gas supply unit 200 may include a gas receiver provided with a filter to receive impurity-removed gas from the outside, a buffer for temporarily storing the received gas, a humidity controller for controlling a humidity of the gas, and a temperature controller for controlling a temperature of the gas.

As shown in FIG. 3, the fan filter unit 300 may be mounted on the chamber 100 to blow the air supplied from the gas supply unit 200, into the processing space A. Specifically, the fan filter unit 300 may include a blower fan 310 for generating blowing force to blow the air into the processing space A, and a perforated plate 320 including a plurality of holes and provided in a flat plate shape having an area corresponding to a range of rotation of the blower fan 310. In this case, the plurality of holes may be uniformly provided at regular intervals in the perforated plate 320 to induce the air supplied from the gas supply unit 200 to be uniformly spread and blown into the processing space A of the chamber 100.

As shown in FIG. 3, the ejection unit 500 may be mounted above the substrate support unit 400 in the processing space A to eject at least one type of liquid chemical onto the substrate S through an ejection nozzle 510.

For example, the ejection unit 500 may receive a plurality of liquid chemicals from the above-described distribution supplier 1200 of the liquid chemical supply module 1000 according to an embodiment of the present invention and eject the liquid chemicals onto the substrate S through the ejection nozzle 510 provided with an ejection channel 511 in which the liquid chemicals flow. Although not shown in the drawings, a plurality of ejection units 500 may be provided. The ejection unit 500 may mainly include the ejection nozzle 510, a support bar 520, and a support shaft 530.

For example, the support shaft 530 may be disposed at a side of the collection unit 600 and rotated or lifted by a driving member 540. The support bar 520 may have an end coupled to the support shaft 530 to support the ejection nozzle 510 mounted at another end thereof.

The ejection nozzle 510 may be swung above the substrate support unit 400 by the rotation of the support shaft 530. Herein, the liquid chemical supplied from the above-described liquid chemical supply module 1000 at a constant flow rate and ejected through the ejection nozzle 510 may be a chemical solution, a rinsing liquid, or a liquid organic solvent, and the flow rate for supplying the liquid chemical may be controlled by the liquid chemical supply module 1000.

Therefore, based on the liquid chemical supply module 1000 according to an embodiment of the present invention and the substrate processing apparatus 10 including the same, because the relief valve 1231 is mounted at a front end of the distribution line 1210 of the distribution supplier 1200 branched from the main line 1110 of the main supplier 1100 and connected to each substrate processing apparatus 10, a pressure of the liquid chemical may be always constantly maintained by bypassing the liquid chemical when the pressure of the liquid chemical is higher than or equal to a set pressure.

Accordingly, particle performance may be improved and equipment and chamber performance deviations between the substrate processing apparatuses 10 may be prevented by constantly maintaining a front pressure of the distribution line 1210 connected to each substrate processing apparatus 10 and minimizing changes in the opening ratio of the FCV 1211 mounted at a rear end of the distribution line 1210 even when a plurality of substrate processing apparatuses 10 eject the liquid chemical.

According to the afore-described embodiments of the present invention, because a relief valve is mounted at a front end of a distribution line of a distribution supplier branched from a main line of a main supplier and connected to each substrate processing apparatus, a pressure of a liquid chemical may be always constantly maintained by bypassing the liquid chemical when the pressure of the liquid chemical is higher than or equal to a set pressure.

As such, a liquid chemical supply module capable of improving particle performance and preventing equipment and chamber performance deviations between substrate processing apparatuses by constantly maintaining a front pressure of a distribution line connected to each substrate processing apparatus and minimizing changes in an opening ratio of a FCV mounted at a rear end of the distribution line even when a plurality of substrate processing apparatuses eject a liquid chemical, and a substrate processing apparatus including the liquid chemical supply module may be implemented. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A liquid chemical supply module comprising:
   a main supplier for supplying a liquid chemical from a liquid chemical tank to at least one substrate processing apparatus; and
   at least one distribution supplier for connecting between the main supplier and any one substrate processing apparatus to distribute the liquid chemical supplied through the main supplier to the any one substrate processing apparatus,
   wherein the distribution supplier comprises:
   a distribution line branched from a main line of the main supplier and connecting between the main line and the any one substrate processing apparatus;
   a first circulation line branched from the distribution line and connecting between the distribution line and the main line to circulate at least a portion of the liquid chemical flowing in the distribution line back to the main line; and
   a second circulation line branched from the distribution line in front of the first circulation line with respect to a direction of the liquid chemical flowing through the distribution line, and connecting between the distribution line and the main line to circulate at least a portion of the liquid chemical flowing in the distribution line back to the main line in front of the first circulation line.

2. The liquid chemical supply module of claim 1, wherein the main supplier comprises:
   the main line for supplying the liquid chemical from the liquid chemical tank; and
   a back pressure valve (BPV) mounted on the main line in front of the distribution line with respect to a direction of the liquid chemical flowing through the main line, to maintain a pressure of the liquid chemical flowing in the main line at a preset certain main pressure.

3. The liquid chemical supply module of claim 2, wherein the main supplier further comprises a pressure sensor mounted on the main line between the BPV and the distribution line to sense the pressure of the liquid chemical flowing in the main line behind the BPV.

4. The liquid chemical supply module of claim 2, wherein the distribution line comprises a flow control valve (FCV)

mounted on the distribution line to control a flow rate of the liquid chemical supplied to the any one substrate processing apparatus.

5. The liquid chemical supply module of claim 4, wherein the distribution line further comprises a first on/off valve mounted on the distribution line behind the FCV with respect to the direction of the liquid chemical flowing through the distribution line, to open or close the distribution line.

6. The liquid chemical supply module of claim 4, wherein the first circulation line is branched from the distribution line behind the FCV with respect to the direction of the liquid chemical flowing through the distribution line, and connected to the main line in front of the BPV with respect to the direction of the liquid chemical flowing through the main line.

7. The liquid chemical supply module of claim 6, wherein the first circulation line comprises a second on/off valve mounted on the first circulation line to open or close the first circulation line.

8. The liquid chemical supply module of claim 6, wherein the second circulation line is branched from the distribution line in front of the FCV with respect to the direction of the liquid chemical flowing through the distribution line, and connected to the main line in front of the BPV with respect to the direction of the liquid chemical flowing through the main line.

9. The liquid chemical supply module of claim 8, wherein the second circulation line comprises a relief valve mounted at a position where the second circulation line is branched from the distribution line, to circulate at least a portion of the liquid chemical flowing in the distribution line back to the main line when the pressure of the liquid chemical flowing in the distribution line exceeds a preset certain distribution pressure.

10. The liquid chemical supply module of claim 9, wherein the second circulation line further comprises a third on/off valve mounted on the second circulation line to open or close the second circulation line.

11. The liquid chemical supply module of claim 4, wherein the distribution line further comprises a flowmeter mounted on the distribution line in front of the FCV with respect to the direction of the liquid chemical flowing through the distribution line, to measure a flow rate of the liquid chemical flowing in the distribution line.

12. The liquid chemical supply module of claim 11, wherein the distribution line further comprises a flow controller electrically connected to the FCV and the flowmeter to receive a value of sensing the flow rate of the liquid chemical from the flowmeter and apply a control signal to the FCV.

13. The liquid chemical supply module of claim 12, wherein the flow controller applies the control signal to the FCV based on a difference between a preset reference flow rate and an actual flow rate of the liquid chemical calculated using the sensed value received from the flowmeter, to control the difference between the reference flow rate and the actual flow rate of the liquid chemical within a preset certain error range.

14. The liquid chemical supply module of claim 2, wherein the main supplier sets the main pressure of the liquid chemical having passed through the BPV and flowing in the main line, to be higher than a distribution pressure of the liquid chemical distributed through the distribution supplier and supplied to the any one substrate processing apparatus.

15. The liquid chemical supply module of claim 1, wherein the distribution supplier comprises a plurality of distribution suppliers mounted at certain intervals along the main line of the main supplier to distribute the liquid chemical supplied through the main supplier, to a plurality of substrate processing apparatuses.

16. The liquid chemical supply module of claim 15, wherein the distribution suppliers comprise:
a first distribution supplier for connecting between the main line and a first substrate processing apparatus; and
a second distribution supplier for connecting between the main line and a second substrate processing apparatus behind the first distribution supplier with respect to a direction of the liquid chemical flowing through the main line.

17. The liquid chemical supply module of claim 16, wherein each of the first and second distribution suppliers comprises the distribution line, the first circulation line, and the second circulation line.

18. The liquid chemical supply module of claim 16, wherein the distribution suppliers further comprise an nth distribution supplier for connecting between the main line and an nth substrate processing apparatus behind an (n−1)th distribution supplier with respect to the direction of the liquid chemical flowing through the main line.

19. A substrate processing apparatus comprising:
a chamber comprising a processing space where a substrate is processed;
a substrate support unit mounted in the processing space to support and rotate the substrate;
an ejection unit mounted above the substrate support unit in the processing space to eject at least one type of liquid chemical onto the substrate through an ejection nozzle;
a liquid chemical supply module for supplying the liquid chemical to the ejection unit; and
a collection unit provided in a vessel shape with an open top to surround the substrate support unit and mounted in the processing space to collect the liquid chemical scattered from the substrate when the substrate rotates,
wherein the liquid chemical supply module comprises:
a main supplier for supplying the liquid chemical from a liquid chemical tank to the ejection nozzle of the ejection unit; and
a distribution supplier for connecting between the main supplier and the ejection nozzle to distribute the liquid chemical supplied through the main supplier to the ejection nozzle of the ejection unit, and
wherein the distribution supplier comprises:
a distribution line branched from a main line of the main supplier and connecting between the main line and the ejection nozzle;
a first circulation line branched from the distribution line and connecting between the distribution line and the main line to circulate at least a portion of the liquid chemical flowing in the distribution line back to the main line; and
a second circulation line branched from the distribution line in front of the first circulation line with respect to a direction of the liquid chemical flowing through the distribution line, and connecting between the distribution line and the main line to circulate at least a portion of the liquid chemical flowing in the distribution line back to the main line in front of the first circulation line.

20. A liquid chemical supply module comprising:

a main supplier for supplying a liquid chemical from a liquid chemical tank to at least one substrate processing apparatus; and at least one distribution supplier for connecting between the main supplier and any one substrate processing apparatus to distribute the liquid chemical supplied through the main supplier to the any one substrate processing apparatus, wherein the distribution supplier comprises:

a distribution line branched from a main line of the main supplier and connecting between the main line and the any one substrate processing apparatus;

a first circulation line branched from the distribution line and connecting between the distribution line and the main line to circulate at least a portion of the liquid chemical flowing in the distribution line back to the main line; and a second circulation line branched from the distribution line in front of the first circulation line with respect to a direction of the liquid chemical flowing through the distribution line, and connecting between the distribution line and the main line to circulate at least a portion of the liquid chemical flowing in the distribution line back to the main line in front of the first circulation line, wherein the main supplier comprises:

the main line for supplying the liquid chemical from the liquid chemical tank;

a back pressure valve (BPV) mounted on the main line in front of the distribution line with respect to a direction of the liquid chemical flowing through the main line, to maintain a pressure of the liquid chemical flowing in the main line at a preset certain main pressure; and a pressure sensor mounted on the main line between the BPV and the distribution line to sense the pressure of the liquid chemical flowing in the main line behind the BPV, wherein the distribution line comprises:

a flow control valve (FCV) mounted on the distribution line to control a flow rate of the liquid chemical supplied to the any one substrate processing apparatus;

a flowmeter mounted on the distribution line in front of the FCV with respect to the direction of the liquid chemical flowing through the distribution line, to measure a flow rate of the liquid chemical flowing in the distribution line; and a first on/off valve mounted on the distribution line behind the FCV with respect to the direction of the liquid chemical flowing through the distribution line, to open or close the distribution line, wherein the first circulation line is branched from the distribution line behind the FCV with respect to the direction of the liquid chemical flowing through the distribution line, and connected to the main line in front of the BPV with respect to the direction of the liquid chemical flowing through the main line, and wherein the second circulation line is branched from the distribution line in front of the FCV with respect to the direction of the liquid chemical flowing through the distribution line, and connected to the main line in front of the BPV with respect to the direction of the liquid chemical flowing through the main line, and comprises a relief valve mounted at a position where the second circulation line is branched from the distribution line, to circulate at least a portion of the liquid chemical flowing in the distribution line back to the main line when the pressure of the liquid chemical flowing in the distribution line exceeds a preset certain distribution pressure.

* * * * *